(12) United States Patent
Jin et al.

(10) Patent No.: US 7,628,253 B2
(45) Date of Patent: Dec. 8, 2009

(54) SENSOR MODULE COMPRISING ACCELERATION SENSOR AND RELATIVE DISPLACEMENT SENSOR, DAMPER AND ELECTRONICALLY CONTROLLABLE SUSPENSION SYSTEM COMPRISING THE SAME, AND METHOD OF CONTROLLING VEHICLE MOVEMENT USING THE SAME

(75) Inventors: Min-Ho Jin, Gyeongsangnam-do (KR); Dong-Rak Lee, Busan (KR); Bong-Geun Cho, Busan (KR); Hyung-Jun Moon, Busan (KR)

(73) Assignee: S&T Daewoo Co., Ltd, Gijang-gun, Busan (KP)

( * ) Notice: Subject to any disclaimer, the term of this patent is extended or adjusted under 35 U.S.C. 154(b) by 49 days.

(21) Appl. No.: 11/965,487

(22) Filed: Dec. 27, 2007

(65) Prior Publication Data
US 2009/0071772 A1 Mar. 19, 2009

(30) Foreign Application Priority Data
Sep. 17, 2007 (KR) .................. 10-2007-0094185
Nov. 21, 2007 (KR) .................. 10-2007-0119109

(51) Int. Cl.
*F16F 9/12* (2006.01)
(52) U.S. Cl. ................... 188/266.1; 188/267
(58) Field of Classification Search ...... 188/266–266.6, 188/267–267.2; 280/5.507–5.515
See application file for complete search history.

(56) References Cited

U.S. PATENT DOCUMENTS

| 6,131,709 | A  | * | 10/2000 | Jolly et al. | 188/267.2 |
| 6,390,252 | B1 | * | 5/2002 | Namuduri et al. | 188/267.2 |
| 7,493,995 | B2 | * | 2/2009 | Sas et al. | 188/267 |
| 2004/0090020 | A1 | * | 5/2004 | Braswell | 280/5.515 |
| 2004/0124049 | A1 | * | 7/2004 | St. Clair et al. | 188/266 |
| 2004/0215380 | A1 | * | 10/2004 | Song | 701/37 |
| 2007/0017758 | A1 | * | 1/2007 | Or et al. | 188/267.2 |
| 2008/0110710 | A1 | * | 5/2008 | Berberich | 188/266.2 |
| 2008/0264743 | A1 | * | 10/2008 | Lee et al. | 188/266 |

* cited by examiner

*Primary Examiner*—Christopher P Schwartz
(74) *Attorney, Agent, or Firm*—Baker & Daniels LLP

(57) ABSTRACT

The present invention relates to a sensor module comprising a relative displacement sensor and an acceleration sensor, and a damper equipped with the same. The damper comprises a cylinder which is formed with a hollow portion therein; a piston rod which is inserted through an upper portion of the cylinder; a piston valve which is connected with an end of the piston rod so as to reciprocate in the cylinder, and which is formed with a fluid passing hole formed to be passed through the piston valve up and down; a rod guide which air-tightly closes an upper end of the cylinder and has a though-hole in which the piston rod is inserted; and a sensor module which is provided with an acceleration sensor for detecting an acceleration at least in a z-axial direction and a displacement sensor for detecting a displacement of the piston rod and which is coupled with the rod guide.

15 Claims, 9 Drawing Sheets

SENSOR MODULE COMPRISING ACCELERATION SENSOR AND RELATIVE DISPLACEMENT SENSOR, DAMPER AND ELECTRONICALLY CONTROLLABLE SUSPENSION SYSTEM COMPRISING THE SAME, AND METHOD OF CONTROLLING VEHICLE MOVEMENT USING THE SAME

BACKGROUND OF THE INVENTION

This application claims the benefit of Korean Patent Application No. 10-2007-0094185, filed on Sep. 17, 2007, and Korean Patent Application No. 10-2007-0119109 filed in Korea on Nov. 21, 2007, in Korea, which is hereby incorporated by reference for all purposes as if fully set forth herein.

Field of the Invention

The present invention relates to a sensor module which is directly provided at a damper to control a damping force of the damper and a method of controlling a vehicle movement using the same, and more particularly, to a sensor module comprising a relative displacement sensor for detecting a movement of a piston rod and an acceleration sensor for measuring a relative acceleration of the damper, a damper equipped with the same and a method of controlling a vehicle movement using the same.

Discussion of the Related Art

In general, a suspension is provided between a car body and a wheel so as to improve driving comport. The suspension includes a chassis spring for absorbing vibration and shock from a road surface, and a damper for damping free vibration of the chassis spring.

The damper functions to absorb the free vibration of the chassis spring by converting vertical kinetic energy into heat energy, thereby rapidly damping the free vibration of the chassis spring.

Recently, in a high-class vehicle, there is widely used an active controlled suspension system which detects a body status of the vehicle and then feeds back the detecting results so as to electronically control a damping force of the damper.

As one of various methods of electronically controlling the damping force of the damper, there is generally used a method in which a fluid passing hole is formed in a piston valve reciprocating in a cylinder and the movement of fluid through the fluid passing hole is adjusted.

The method of adjusting the movement of fluid through the fluid passing hole is classified into a way of adjusting a sectional area of the fluid passing hole using a spring and a way that fills electro-rheological fluid or magneto-rheological fluid in the cylinder and then adjusts a flowing resistance of the fluid using an electronic or magnetic property of the fluid.

Meanwhile, in order to electronically control the damping force of the damper, first of all, it is important to exactly detect the body status of the car. Thus, a sensor for detecting the body status of car is needed.

In a conventional active controlled suspension system, to determine the body status of the car, a link type sensor is provided independently of the damper between a chassis and a wheel axle (or the wheel) to detect a degree of vibration or shock from a road surface. Then, by using the detected result, an operation of the damper is controlled indirectly.

However, in order to dispose the link sensor between a car body and an axle (or a wheel), a considerable space is required and this becomes a burden on a design of car.

Therefore, to solve the problem, there is a growing need for a small-sized sensor which can directly detect the operation of the damper. However, it has still failed to provide a sensor having enough stability and durability to be used for a long time in the car which is always exposed to vibration and shock.

For example, since a contact type sensor (e.g., potential meter) which is used for controlling an actuator is attached to a piston rod or a piston valve to detect a moving status thereof, there is a problem that the sensor may often be damaged by friction and thus a life span thereof is reduced.

In addition, an optical sensor is weak in shock and also, if light is excluded by foreign substances, the optical sensor can be used no longer.

Further, in the conventional active controlled suspension system, since the damping force of the damper is typically controlled using the results detected by one sensor, if the sensor is damaged, it is impossible to control the operation of the damper. Therefore, there is a necessity to prepare measures against the trouble of the sensor.

Furthermore, since various sensors, which are provided in a vehicle with the conventional active controlled suspension system so as to analyze the vehicle movement, are respectively installed at different positions according to a vehicle model, the movement analyzing mechanism is also changed according to the vehicle model.

And the high-class vehicle with the active controlled suspension system is designed in consideration of the installation of sensors, but in other vehicles, the installation of sensors is not reflected in the designs thereof. Thus, it is impossible or it costs lots of money to additionally install the active controlled suspension system.

SUMMARY OF THE INVENTION

Accordingly, the present invention is directed to a sensor module comprising a relative displacement sensor and an acceleration sensor, and a damper equipped with the same that substantially obviate one or more of problems due to limitations and disadvantages of the related art.

It is an object of the present invention to provide a sensor module which is directly provided at a damper so as to directly and exactly detect a movement of the damper and then to precisely control a damping force of the damper based on the detected results.

It is another object of the present invention to provide a sensor module which can prepare for the trouble of the sensor and more stably control the damper.

It is yet another object of the present invention to analyze a vehicle movement and then electronically control the movement with a low cost even in case of the vehicle which is not provided with the high-priced active controlled suspension system, thereby increasing stability of the vehicle.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, the present invention provides a damper comprising a cylinder which is formed with a hollow portion therein; a piston rod which is inserted through an upper portion of the cylinder; a piston valve which is connected with an end of the piston rod so as to reciprocate in the cylinder, and which is formed with a fluid passing hole formed to be passed through the piston valve up and down; a rod guide which air-tightly closes an upper end of the cylinder and has a though-hole in which the piston rod is inserted; and a sensor module which is provided with an acceleration sensor for detecting an acceleration at least in a z-axial direction and a displacement sensor for detecting a displacement of the piston rod and which is coupled with the rod guide.

Preferably, the rod guide is formed with a coupling hole which is communicated from an outer surface to the through-hole, and the sensor module is inserted into the coupling hole.

Preferably, the coupling hole is opened toward an upper surface of the rod guide, and a d fixing cap for fixing the sensor module inserted into the coupling hole is coupled to an upper portion of the rod guide.

Preferably, the coupling hole is formed with an expanded portion which is wider than an entrance formed at the outer surface of the rod guide, and a housing of the sensor module is formed with a protruded portion which is inserted into the expanded portion so as to prevent the sensor module from being separated from the rod guide.

Preferably, a groove pattern, in which a concave portion and a convex portion are formed alternately and which is formed in a direction substantially perpendicular to a movement direction of the piston rod, is formed on a portion of the piston rod, and the displacement sensor is a non-contact type comprises a magnet for generating magnetic field; a GMR sensor which is disposed between the magnet and the piston rod so as to detect a change of the magnetic field generated by the groove pattern when the piston rod is moved and thus to output an electric signal; a signal processing part which processes an output signal from the GMR sensor and then outputs a square wave.

Preferably, the GMR sensor has a construction in which a serially connected pair of a first resistance element and a second resistance element is disposed be parallel with a serially connected pair of a third resistance element and a fourth resistance element, and the electric signal is an output voltage generated by the change of the magnetic field between a first node between the first and second resistance elements and a second node between the third and fourth resistance elements.

Preferably, the GMR sensor is provided with a first sub-sensor and a second sub-sensor which detect the change of the magnetic field and than output the electric signal, respectively, and ends of the first and second sub-sensors and are spaced away from each other at a desired distance in the moving direction of the piston rod, and when the piston rod is moved, the output signals from the first and second sub-sensors are respectively generated with a time lag.

It is to be understood that both the foregoing general description and the following detailed description are exemplary and explanatory and are intended to provide further explanation of the invention as claimed.

BRIEF DESCRIPTION OF THE DRAWING

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to the illustrated embodiment of the present invention, which is illustrated in the accompanying drawings.

Figure 1:
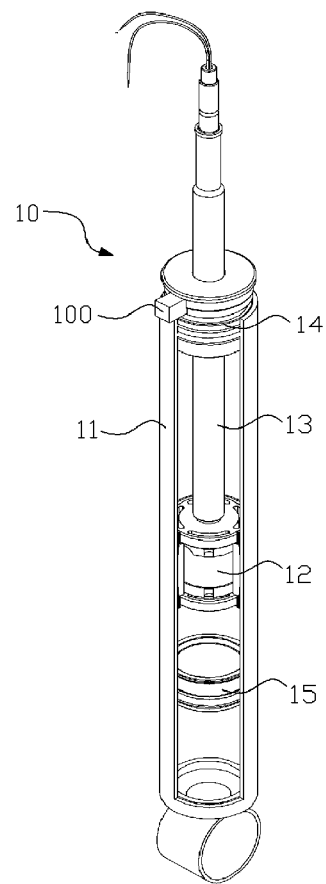
FIG. 1 is a perspective view, partially cutaway, of a damper with a sensor module according to an embodiment of the present invention.

FIG. 1 is a perspective view, partially cutaway, of a damper 10 with a sensor module according to an embodiment of the present invention, wherein a damping force of the damper is controlled by using magneto-rheological fluid.

The damper 10 includes a cylinder 11 having a longitudinal hollow portion therein, a piston rod 13 which is inserted through an upper portion of the cylinder 11, a piston valve 12 which is connected with a lower end of the piston rod 13 so as to reciprocate in the cylinder 11, a rod guide 14 which is coupled to an upper end of the cylinder 11 so as to air-tightly close the cylinder 11 and also guide an up/down movement of the piston rod 13, and a floating piston 15 which is disposed at a lower side of the piston valve 12 so as to compensate a volume change due to the up/down movement of the piston rod 13.

Figure 2:
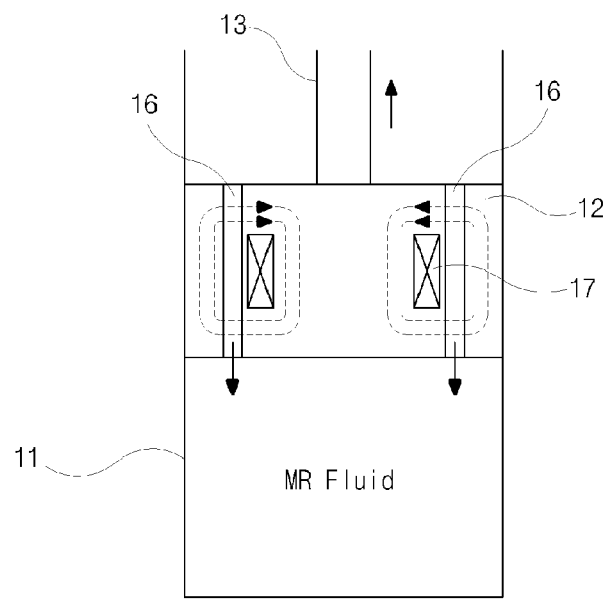
FIG. 2 is a view showing an operation principle of an MR damper.

In the damper 10 using the magneto-rheological fluid, as shown in FIG. 2, the cylinder 11 is filled with the magneto-rheological fluid, and the piston valve 12 is provided with a fluid passing hole 16 through which the magneto-rheological fluid is passed and a solenoid coil 17 for controlling the magneto-rheological fluid passing through the fluid passing hole 16.

The magneto-rheological fluid contains metal particles which can be magnetized and thus an apparent viscosity of the magneto-rheological fluid is changed by magnetic field generated around it. Therefore, a flow resistance of the magneto-rheological fluid can be controlled by adjusting a current applied to the solenoid coil 17 and thus controlling the magnetic field around the fluid passing hole 16, thereby controlling the damping force of the damper 10.

The current applied to the solenoid coil 17 is adjusted on the basis of state of a car body, which is detected by a sensor of an ECU in a car.

Especially, according to the embodiment of the present invention, in order to detect the state of the car body, a sensor module 100 is coupled with the rod guide 14. The sensor module 100 includes a relative displacement sensor for detecting a movement of the piston rod 13 in a non-contact way and an acceleration sensor for detecting a vertical and horizontal acceleration of the damper 10.

Figure 3:
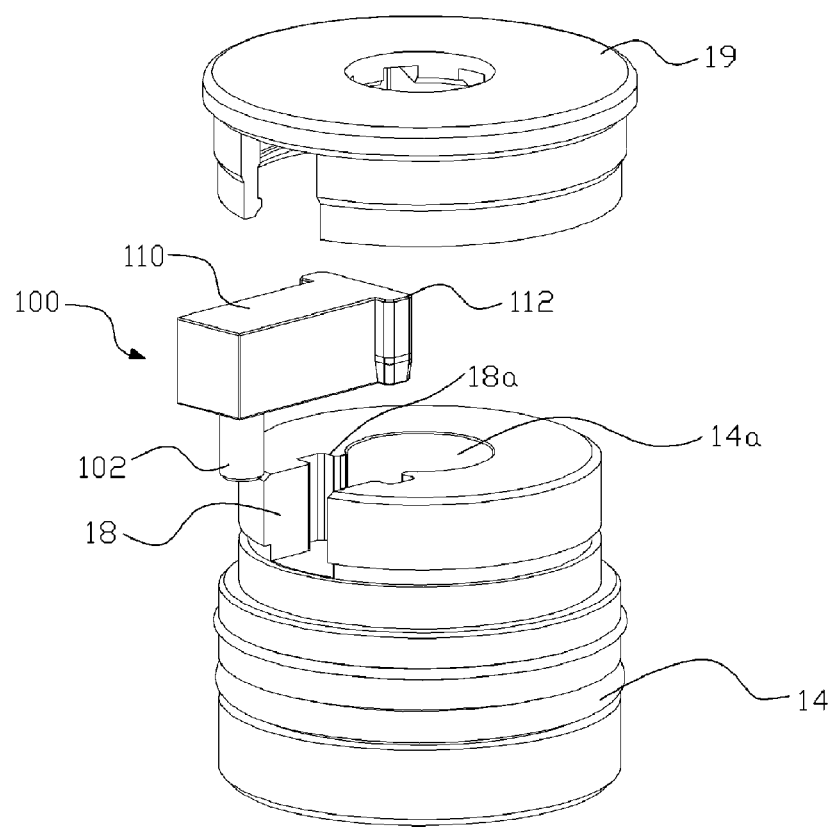
FIG. 3 is an exploded perspective view of a rod guide with which the sensor module is coupled according to the embodiment of the present invention.

As shown in FIG. 3 illustrating the coupling relationship between the sensor module 100 and the rod guide 14, the rod guide 14 is formed with a through-hole 14a in which the piston rod 13 is inserted and a coupling hole 18 which is communicated from an outer surface to the through-hole 14a.

The coupling hole 14 is opened toward an upper surface of the rod guide 14. Meanwhile, an expanded portion 18a which is wider than an entrance of the coupling hole 18 is formed between an inner surface and an outer surface of the rod guide 14.

The sensor module 100 includes a housing 110, the relative displacement sensor and the acceleration sensor (not shown) which are installed in the housing 110, and a cable 102 which is extended to an outside of the housing 110.

The housing 110 is formed with a protruded portion 112 corresponding to the expanded portion 18a. The protruded portion 112 of the housing 110 is inserted into the expanded portion 18a and then a fixing cap 19 is fixedly covered thereon, so that the sensor module 100 is stably fixed to the rod guide 14.

Besides the above-mentioned method, the sensor module 100 may be fixed to the rod guide 14 in any other ways.

Further, the sensor module 100 may be installed at the cylinder 11 so as to be passed through a side wall of the cylinder 11, instead of being installed in the rod guide 14. However, since the sensor module 100 has to be positioned as close as possible to the piston rod 13, it is preferable that the sensor module 100 is installed to the rod guide 14 as described above.

Furthermore, as shown in drawings, instead of forming the coupling hole 18 at the side portion of the rode guide 14, the sensor module 100 may be fixed to an upper portion of the rod guide 14. However, in this case, it is necessary to provide a separate fixing means for fixing the sensor module 100 to the rod guide 14.

Meanwhile, as shown in FIG. 1, on a portion of the piston rod 13, which is detected by the sensor module 100, there is formed a groove pattern (20) in which a concave portion and a convex portion are formed alternately. Due to the groove pattern 20, the relative displacement sensor in the sensor module 100 detects a change in magnetic field and thus detects a relative displacement of the piston rod 13.

Preferably, the groove pattern 20 is formed in a direction (horizontal direction in the drawing) substantially perpendicular to a movement direction (up/down direction in the drawing) of the piston rod 13, and the concave portion and the convex portion are formed parallel with each other and also have a uniform size and pitch. The pitches or shapes of the concave portion and the convex portion are can be properly selected according to a perceived resolution.

A method of detecting the relative displacement using the groove pattern 20 formed on the piston rod 13 will be described later.

Figure 4:
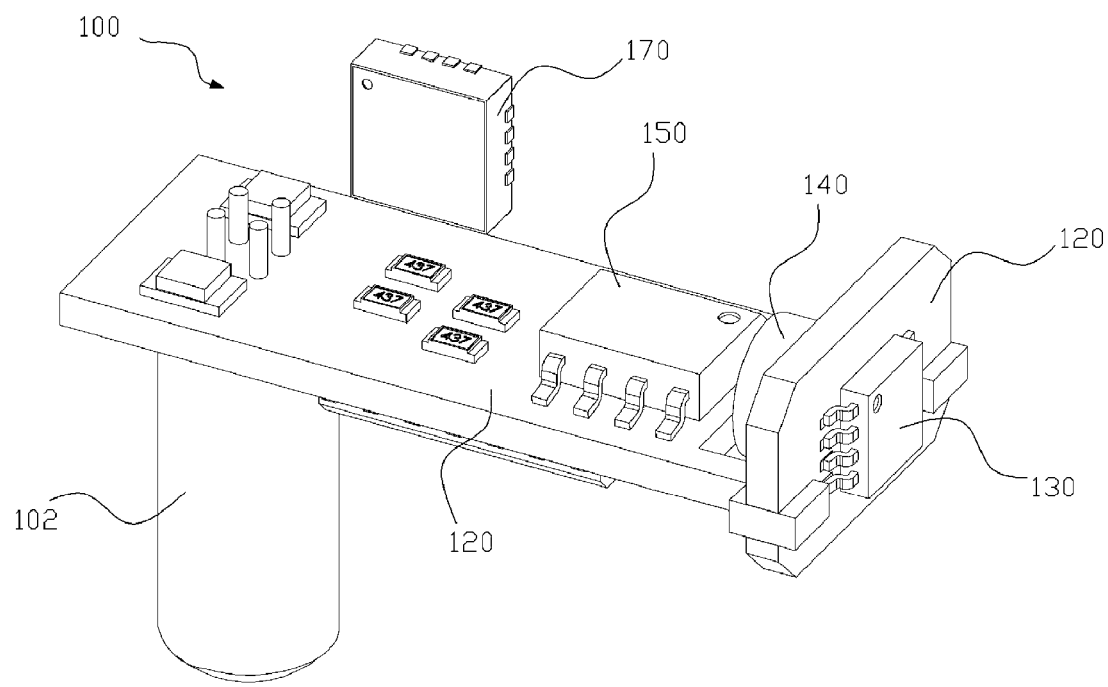
FIG. 4 is a view showing an internal construction of the sensor module according to the embodiment of the present invention.

As shown in FIG. 4, in the housing 110 of the sensor module 100 according to the embodiment of the present invention, there are provided a first PCB 120 which is disposed vertically, a GMR sensor 130 which is coupled to an outside of the first PCB 120, and a permanent magnet 140 which is coupled to an inside of the first PCB 120.

A second PCB 160 is horizontally disposed at the inside of the first PCB 120, and a signal processing part 150 for processing an output signal of the GMR sensor 130 and other attached circuits are mounted on the second PCB 160.

The relative displacement sensor is comprised of the first PCB 120, the GMR sensor 130, the permanent magnet 140, the signal processing part 150 and the like.

Unlike the relative displacement sensor, the acceleration sensor 170 for detecting the vertical and horizontal accelerations of the damper can be fixed to an optional position in the housing 110. Preferably, the acceleration sensor 170 is mounted on the second PCB 160 or other PCB for convenience.

The second PCB 160 is electrically connected with the first PCB 120 on which the GMR sensor 130 is mounted, and also connected with the cable 102 extended to the outside of the housing 110.

The cable 102 includes a power supplying line for supplying power to the GMR sensor 130, the signal processing part 150, the acceleration sensor 170 and the like and, a signal transferring line for transferring the output signal of the signal processing part 150 and the acceleration sensor 170 to the outside (e.g., ECU).

The acceleration sensor 170 may be a z-axial acceleration sensor for detecting an acceleration in a vertical direction, a two-axial acceleration sensor for detecting an acceleration in a z and x-axial direction, or other two-axial acceleration sensor for detecting an acceleration in a z and y-axial direction.

Further, the acceleration sensor 170 may be also a three-axial acceleration sensor for detecting an acceleration in an x, y and z-axial direction, or may include multiple and various kinds of acceleration sensors as described above.

However, in order to perform a complementary function with the relative displacement sensor for detecting the movement of the piston rod 130, a vertical acceleration sensor, i.e., the z-axial acceleration sensor is positively necessary.

As described above, in case that the two kinds of sensors, i.e., the relative displacement sensor having the GMR sensor 130 and the acceleration sensor 170 are included in the sensor module 100 which is directly disposed at the damper 10, it is possible to compare data from each sensor and thus determine whether a certain sensor is out of order.

For example, the ECU receives signals from the acceleration sensor 170 and the GMR sensor 130, and secondarily obtains displacement data of the vehicle or damper from the vertical speed data through an integral arithmetic operation, and secondarily obtains vertical acceleration data of the vehicle or damper from the displacement data through a differential arithmetic operation.

Therefore, if the acceleration data measured by the acceleration sensor 170 is different from the secondarily obtained acceleration data over an error range, or the displacement data measured by the GMR sensor 130 is different from the secondarily obtained displacement data over the error range, it means that at least one sensor is out of order.

Further, although it is found that one sensor is out of order, the damper 10 can be controlled by using the other sensor. Therefore, it is possible to increase stability and reliability in the controlling of the damping force of an electronic controlled suspension system.

Hereinafter, the principle of the GMR sensor 130 and a method of measuring the displacement in a non-contact way using the same are will be described.

The GMR sensor 130 utilizes a property that a resistance value of a built-in resistance element is varied according to an intensity of magnetic field around it, and also it has another property that, even though an input voltage is constant, if the magnetic field is changed, an output voltage thereof is varied.

The GMR sensor 130 mounted on the first PCB 120 is disposed so as to be adjacent to the through-hole 14a of the rod guide 14. Meanwhile, the GMR sensor 130 may be disposed in the housing 110 so as to be isolated from the outside, and also a portion of the housing 110 may be opened to expose the GMR sensor 130 to the outside.

Figure 5:
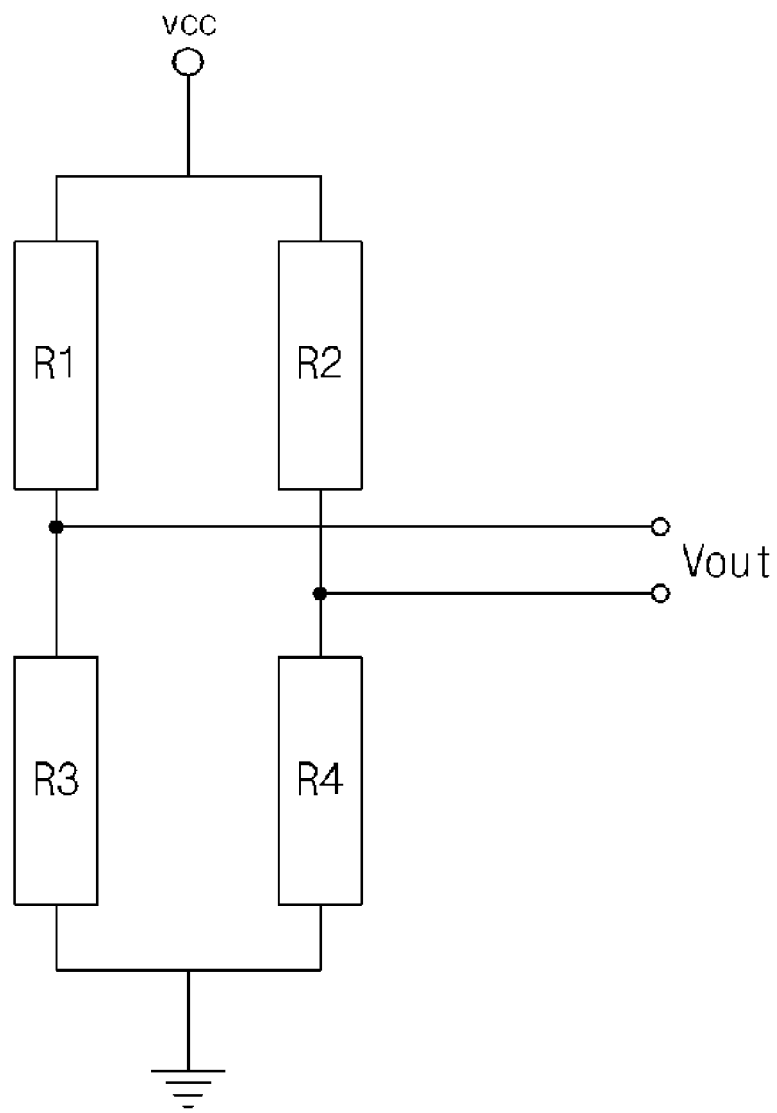
FIG. 5 is a conceptual view of a GMR sensor.

The GMR sensor 130 may be fabricated in various types and the block diagram of FIG. 5 is an example thereof. That is, four resistance elements R1, R2, R3 and R4 are connected in the Wheatstone bridge type to form the GMR sensor 130. At this time, the resistance elements R1, R2, R3 and R4 are formed of metallic thin films and have a property that the resistance value of at least one of them is changed according to the intensity of magnetic field around them.

Accordingly, if the magnetic field is changed around the GMR sensor 130, a resistance balance of the Wheatstone bridge is upset and then a desired output voltage Vout is generated from the GMR sensor 130.

Figure 6:
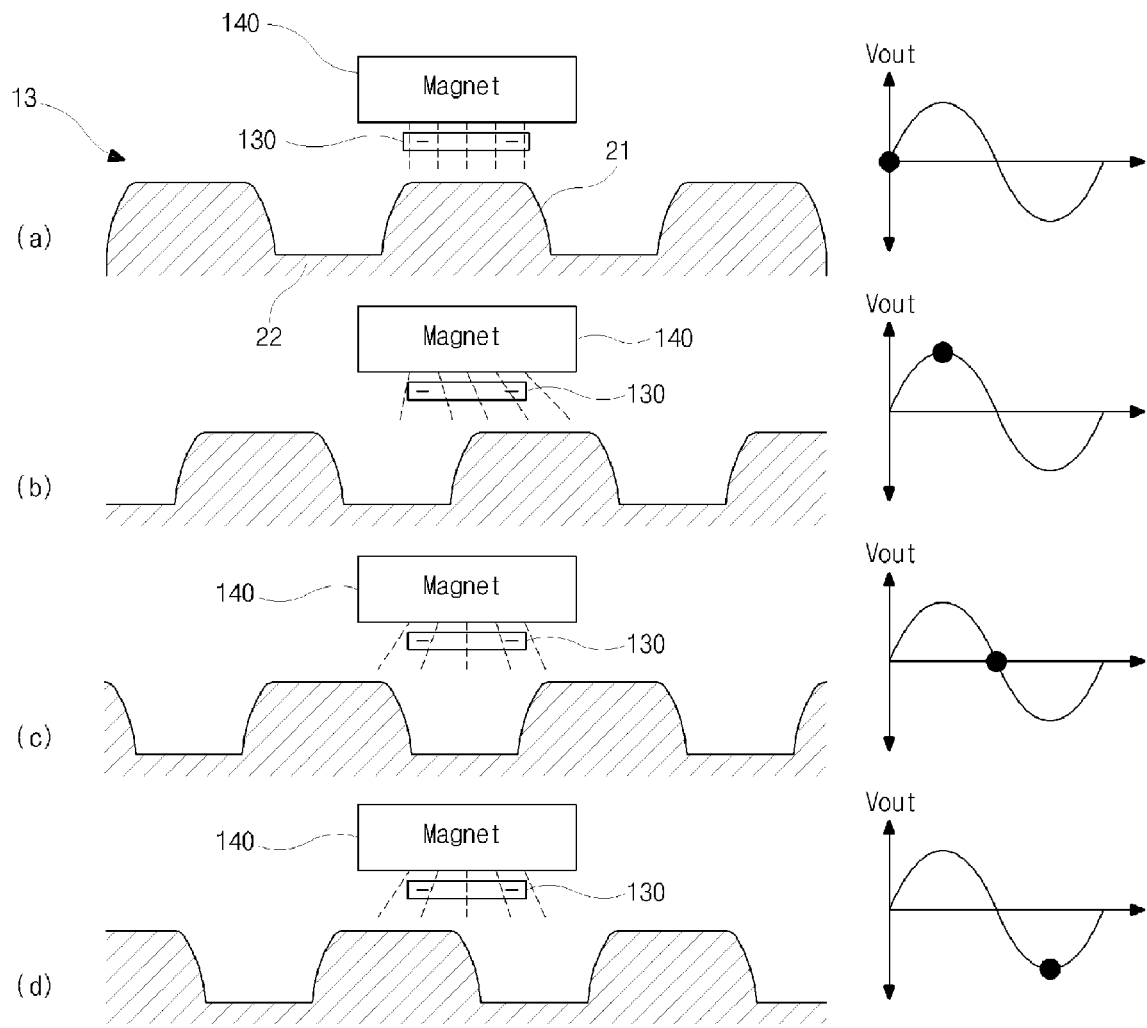
FIG. 6 is a view showing a principle that the GMR sensor detects a movement of an object.

FIG. 6 is a view showing a process that the output voltage Vout of the GMR sensor 130 is changed according to the movement of the piston rod 13.

First of all, if the piston rod 13 is moved in a status that the permanent magnet 140 is disposed to be adjacent to the piston rod 13 having the groove pattern, a distance between the permanent magnet 140 and the piston rod 13 is periodically changed due to the concave portion 21 and the convex portion 22 of the groove pattern. Thus, a magnetic field pattern between the permanent magnet 140 and the piston rod 13 is periodically changed.

Therefore, if the GMR sensor 130 is provided between the permanent magnet 140 and the piston rod 13, the resistance value of the resistance element built in the GMR sensor 130 is varied by the change of the magnetic field and thus the output voltage Vout is periodically changed.

In case that the GMR sensor 130 is has the resistance elements R1, R2, R3 and R4 which are connected as shown in FIG. 5 and also the GMR sensor 130 is positioned at an upper side of the convex portion 21 of the piston rod 13 as shown in FIG. 6A, it is assumed that the resistance value of each resistance elements R1, R2, R3, R4 is balanced and the output voltage Vout becomes zero.

Then, as shown in FIG. 6B, if the piston rod 13 is moved to the right side of the drawing so that the permanent magnet 140 becomes overlapped with the concave portion 22, the resistance balance of the GMR sensor 130 is upset by the change of magnetic field and the output voltage Vout becomes generated.

The output voltage Vout is slowly increased and then reduced again according as the overlapped portion between the GMR sensor 130 and the concave portion 22 is increased. As shown in FIG. 6C, when the permanent magnet 140 is positioned at the just upper side of the concave portion 22, the resistance balance is kept again and thus the output voltage Vout becomes zero.

If the piston rod 13 is continuously moved to the right side of the drawing and the permanent magnet 140 becomes overlapped again with the upper side of the convex portion 21, the resistance balance is upset again and the output voltage Vout is generated. In this case, the output voltage Vout has an opposite polarity to that in FIG. 6A.

In conclusion, while the piston rod 13 having the groove pattern of the convex and concave portions is moved with respect to the permanent magnet 130, the GMR sensor 130 successively generates the sine-wave type output voltage Vout.

Figure 7:
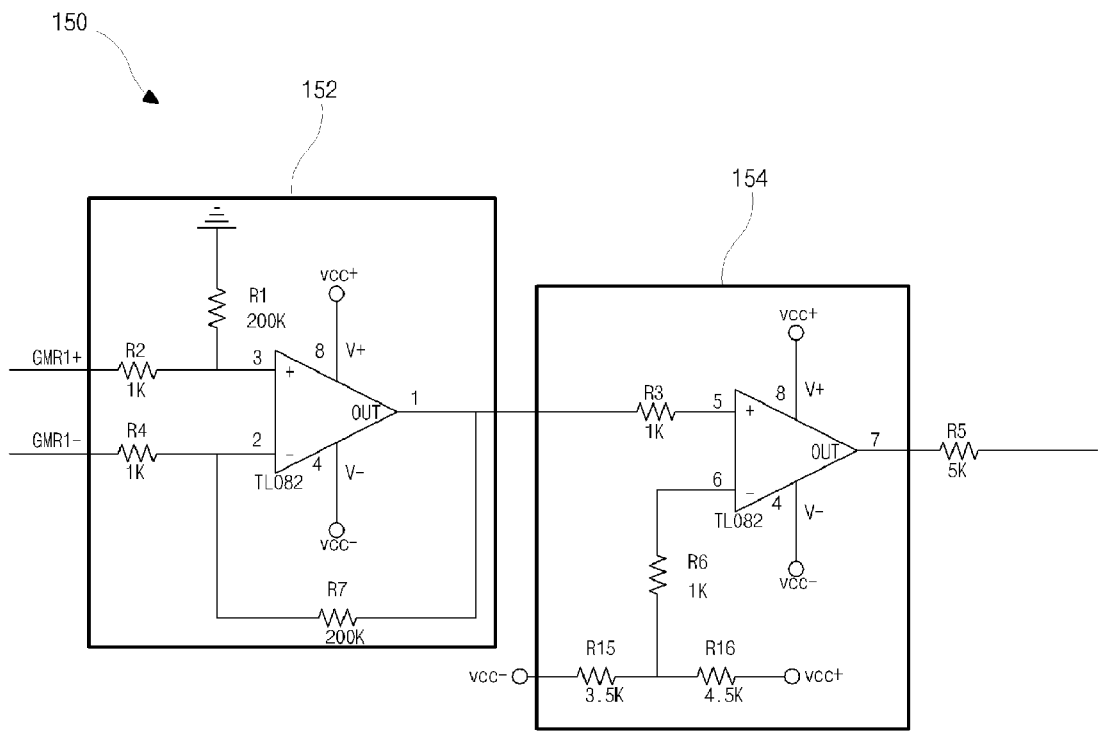
FIG. 7 is a circuit diagram of a signal processing part.

As shown in FIG. 7, the signal processing part 150 includes a signal amplifying part 152 and a digital converting part 154.

The signal amplifying part 152 functions to amplify the output voltage Vout of the GMR sensor 130. For example, in FIG. 7, it is possible to obtain R7/R4, i.e., the output voltage Vout which is amplified 200 times.

The digital converting part 154 functions to convert the signal amplified from the signal amplifying part 152 into a square wave.

Offset data, pulse width, frequency and the like of the square wave output from the digital converting part 154 are transferred to a control module (not shown) for controlling an actuator, and the control module calculates a moving speed and distance of the piston rod 13 using the above transferred data and then outputs a control signal so as to control the damping force of the damper 10.

Meanwhile, it is possible to detect the movement of the piston rod 13 using the above-mentioned GMR sensor 130. However, there is a problem that it is difficult to notice a moving direction of the piston rod 13.

In other words, as shown in FIG. 6B, in case that the output voltage Vout is changed from a maximum value to zero, it is difficult to determine which position of FIG. 6A or 6C the piston rod 13 is placed in.

To solve the problem, in the embodiment of the present invention, the moving direction of the piston rod 13 is detected using the GMR sensor 130 in which two sensors are included in one semiconductor chip. That is, as shown in FIG. 8, the GMR sensor 130 is comprised of a first sub-sensor 130a and a second sub-sensor 130b including the four resistance elements.

At this time, the first and second sub-sensors 130a and 130b are not placed in the same positions, and ends of the first and second sub-sensors 130a and 130b are formed to be apart from each other at a desired distance in the moving direction of the piston rod 13. Thus, since a point of time when the output voltage is generated in each of the first and second sub-sensors 130a and 130b is different, it is possible to confirm the moving direction of an object.

Figure 8:
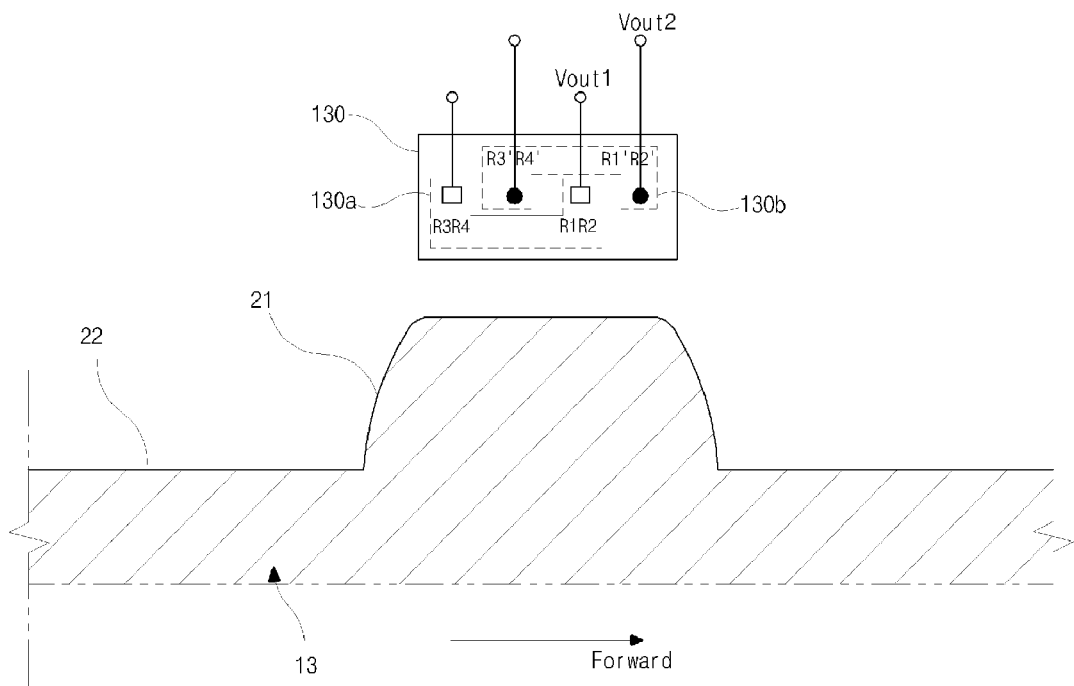
FIG. 8 is a view show a status that the GMR sensor with two sub-sensors detects the object.

That is, if the piston rod 13 is moved to the right side of FIG. 8, the concave portion 22 of the GMR sensor 130 is approached to a lower portion of the GMR sensor 130. At this time, the first sub-sensor 130a is positioned earlier on the concave portion 22 than the second sub-sensor 130b.

Therefore, due to the change of magnetic field, the output voltage is firstly generated from the first sub-sensor 130a and then generated later from the second sub-sensor 130b after a desired time is elapsed.

Figure 9A:
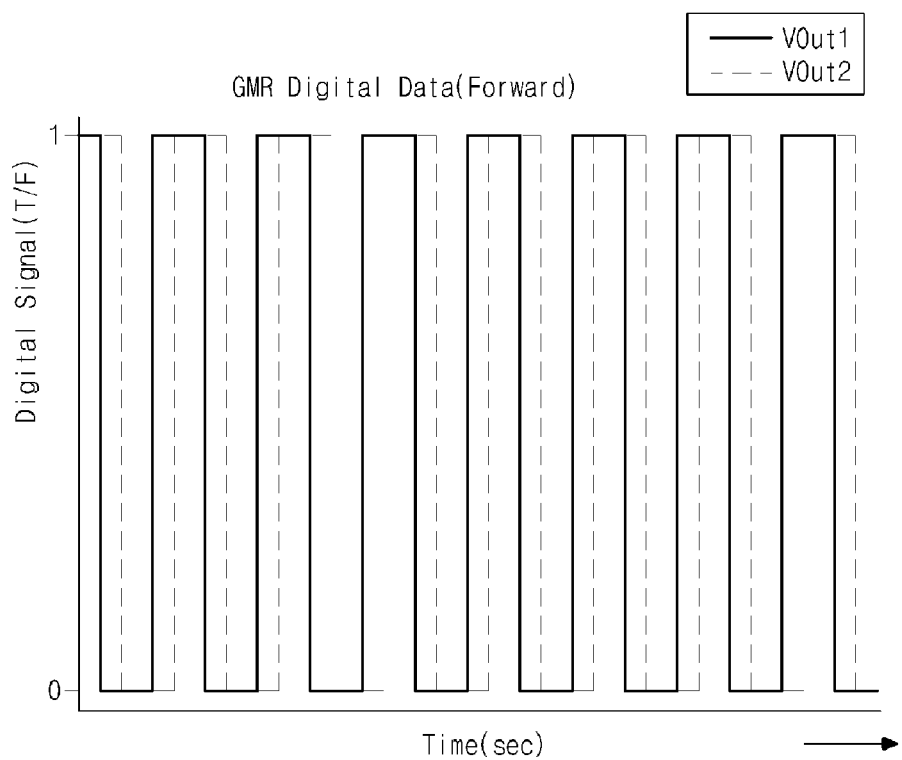
FIGS. 9A and 9B views a status that output signals of the two sub-sensors has a time difference according to a moving direction of the object.

In this case, the output signal shows a pattern in FIG. 9A. By the pattern, it will be understood that the output signal Vout1 of the first sub-sensor 130a temporally precedes the output signal Vout2 of the second sub-sensor 130b.

If the piston rod 13 is moved to the left side of the drawing, the output voltage is generated firstly from the second sub-sensor 130b and then generated later from the first sub-sensor 130a.

Figure 9B:
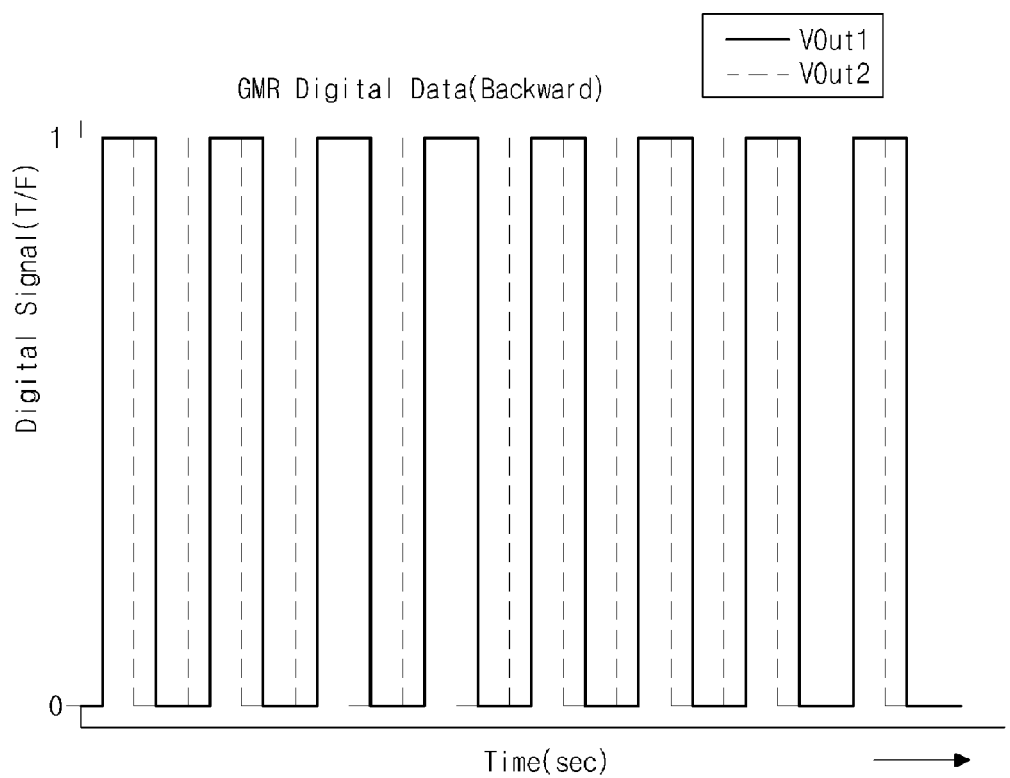

In this case, as shown in FIG. 9B, the output signal Vout2 of the second sub-sensor 130b temporally precedes the output signal Vout1 of the first sub-sensor 130a.

Thus, it is possible to grasp the movement direction of the piston rod 13 by using the generating order of the output signals of the first and second sub-sensors 130a and 130b.

Figure 10:
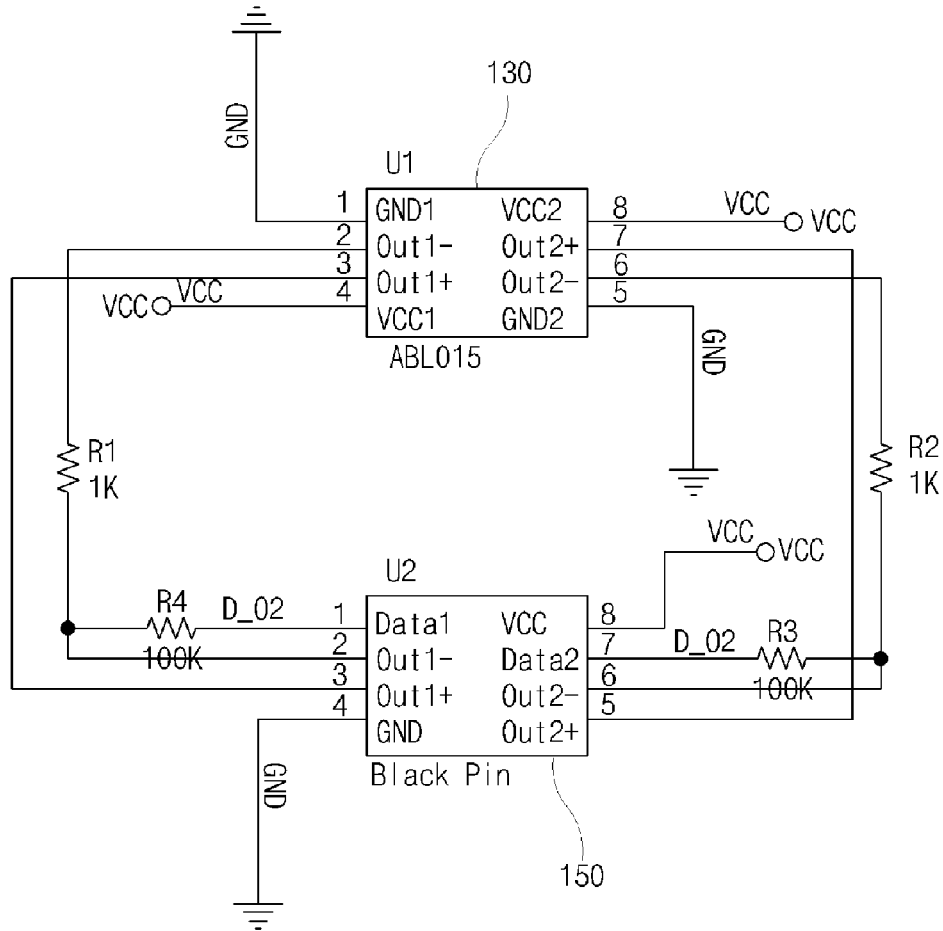
FIG. 10 is a circuit diagram showing a connection status between the GMR sensor with the two sub-sensors and the signal processing part.

FIG. 10 is a circuit diagram showing a connection status between the GMR sensor with the two sub-sensors and the signal processing part.

The GMR sensor 130 has an independent output terminal for each sub-sensor, and the signal processing part 150 processes separately the signal of each output terminal of the GMR sensor 130 and then outputs the signal in the form of a square wave.

As described above, the sensor module 100 can control a resolution by adjusting the pitch of the concave portion 21 and the convex portion 22 formed on the piston rod 13. In case that the sensor module 10 is substantially coupled to a vehicle damper 10, it can be fabricated in a small size having a diameter of 12 mm and a length of 25 mm.

Furthermore, in theory, even though the pitch between the concave portion 21 and the convex portion 22 is 10 μm, it is possible to detect the movement of the piston rod 13. Thus, the damping force of the damper 10 can be controlled precisely.

Meanwhile, since the piston rod 13 is mainly formed of iron, it is preferable that a plating layer is formed on a surface of the piston rod 13 so as to increase corrosion resistance. At this time, the plating layer has an enough thickness to fill in all of the concave portions 21 of the groove pattern 20 and then the piston rod 13 is treated by a grinding process to have a smooth surface.

However, although the piston rod 13 has the plating layer, the sensor module 100 has to be capable of detect the movement of the concave portion 21 and the convex portion 22 which are placed below the plating layer.

Accordingly, it is preferable that the plating layer is formed of a non-magnetic material like Cr which is not affected by the magnetic field generated from the sensor module 100.

Hereinafter, a method of analyzing a vehicle movement using the sensor module 100 of the embodiments of the present invention will be described.

In the present invention, for convenience of explanation, a front and rear direction of the vehicle is defined as an x-axle, a left and right direction thereof is defined as a y-axle and a vertical direction thereof is defined as a z-axle. The acceleration sensor for detecting all of x, y and z axial accelerations is called a three-axial acceleration sensor, the acceleration sensor for detecting x and z axial accelerations is called an x-z axial acceleration sensor, the acceleration sensor for detecting y and z axial accelerations is called a y-z axial acceleration sensor, the acceleration sensor for detecting only a z axial acceleration is called a z axial acceleration sensor, and the x-z axial acceleration sensor and the y-z axial acceleration sensor are combined with each other and called a two-axial acceleration sensor.

Figure 11:
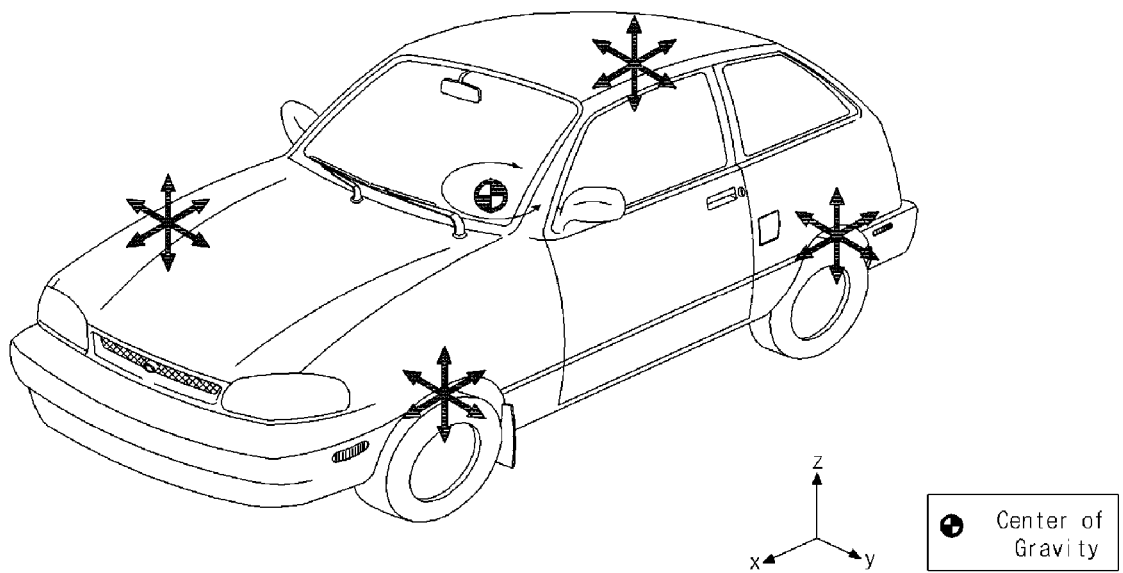
FIG. 11 is a view showing accelerations measured in case that all of dampers for a vehicle are equipped with a three-axial acceleration sensor.

FIG. 11 is a view showing a case that dampers according to the embodiments of the present invention are provided at all positions, for example, each end of front and rear axles of the vehicle and between chassis, where the damper has to be installed, wherein the sensor module 100 of each damper is equipped with the three-axial acceleration sensors and arrows near the wheels designate acceleration directions.

If the sensor module 100 is installed in this way, the control module (not shown) of the vehicle can analyze the vehicle movement using the acceleration data in each direction, which are measured by four three-axial acceleration sensors.

For example, a road status is determined on the basis of the z-axial acceleration measured by the three-axial acceleration sensors and the damping force of each damper is controlled according to the road status.

Further, on the basis of the x-axial acceleration, an acceleration and deceleration of the vehicle and a shaking degree in the front and rear directions, i.e., a pitch angle are determined and thus the damping forces of the dampers which are respectively provided at the front and rear sides of the vehicle are controlled independently, thereby reducing the shaking of the vehicle when the vehicle is started and stopped suddenly.

And on the basis of the y-axial acceleration as a transverse acceleration of the vehicle, a shaking degree in the transverse direction, i.e., a rolling angle is determined and thus the damping forces of the dampers which are respectively provided at the left and right sides of the vehicle are controlled independently, thereby reducing the shaking of the vehicle when the vehicle is turned on a dime.

Furthermore, based on the x and y-axial accelerations, it is possible to estimate a rotational force with respect to a center of gravity of the vehicle, i.e. Yaw rate. In other words, a torque with the center of gravity of the vehicle can be obtained by vector composition of the x and y-axial accelerations measured by each sensor module, and the Yaw rate is estimated based on the torque.

According to the damper 10 of the embodiments of the present invention, because the damper 10 itself is provided with the sensor module 100 including the acceleration sensor, although a separate sensor is not provided at the vehicle body, it is possible to obtain various acceleration data at the position that each damper 10 is installed. And by using such the acceleration data, it is also possible to obtain various information of the pitch angle, rolling angle, Yaw rate and the like.

In the conventional active controlled suspension system, various sensors (including the acceleration sensor) which is necessary for the electronic control had to be provided at various positions of the vehicle, and thus spaces for the sensors also had to be secured.

Therefore, it is structurally impossible to additionally realize the electronic control way in other vehicles in which such design items are not considered, or it costs a great deal.

However, since the sensor module 100 which is necessary for analyzing the vehicle movement is provided in the damper 10 of the present invention, by replacing the existing damper with the damper 10 of the present invention, it is possible to simply realize the active controlled suspension system even in the vehicles in which such design items are not considered.

In this case, it is necessary to update a program for the movement analysis and the controlling in the control module or additionally provide a separate control module.

In fact, prices for realizing the active controlled suspension system by replacing the existing damper with the damper 10 of the present invention is much lower than those for providing the conventional active controlled suspension system.

Further, since it is possible to simply realize the active controlled suspension system by replacing the damper, it can be applied to any vehicle, and thus it is possible to considerably improve the stability of vehicle.

Meanwhile, in order to further completely analyze the vehicle movement, it is preferable that the sensor module 100 of the present invention is provided at all of the vehicle wheels. However, if necessary, the number of the sensor modules 100 to be installed may be reduced, or the sensor module 100 may be equipped with other kinds of acceleration sensors instead of the three-axial acceleration sensor.

Figure 12:
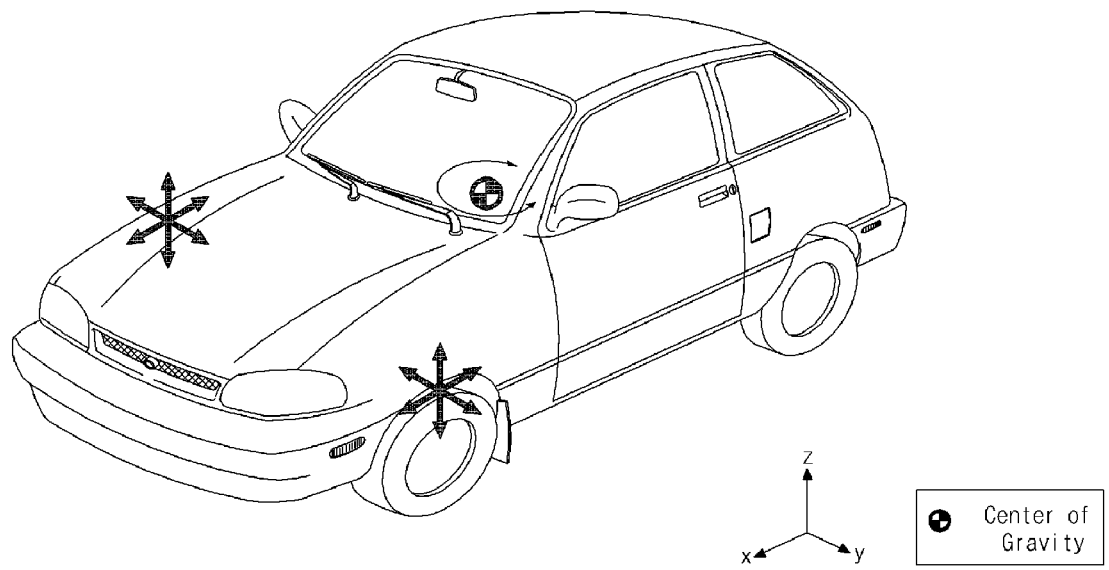
FIG. 12 is a view showing accelerations measured in case that the dampers equipped with the three-axial acceleration sensor are provided only at both sides of a front axle of the vehicle.

For example, as shown in FIG. 12, the damper 10 equipped with the three-axial acceleration sensor may be provided only at both ends of the front axle of the vehicle.

In this case, the z-axial acceleration measured by each acceleration sensor can be used for determining the road status and controlling the damping force of the damper.

The x-axial acceleration can be used for determining the acceleration and deceleration of the vehicle and the pitch angle and independently controlling the damping force of each damper provided at the front and rear sides of the vehicle.

The y-axial acceleration as the transverse acceleration of the vehicle can be used for determining the rolling angle and properly controlling the damping force of each damper provided at the left and right sides of the vehicle.

And the x and y-axial accelerations can be used as data for estimating the Yaw rate.

For example, the movement information of the rear wheel in which the acceleration sensor is not provided may be estimated by assuming that it is the same as that of the front wheel on the x-axle or by using other methods.

Meanwhile, in case that the minimum number of sensor modules 100 are provided, in order to electronically control the vehicle movement after the analyzing of the vehicle movement, the damper provided at the rear axle has to be capable of being controlled electrically. This is the same in other embodiments.

Figure 13:
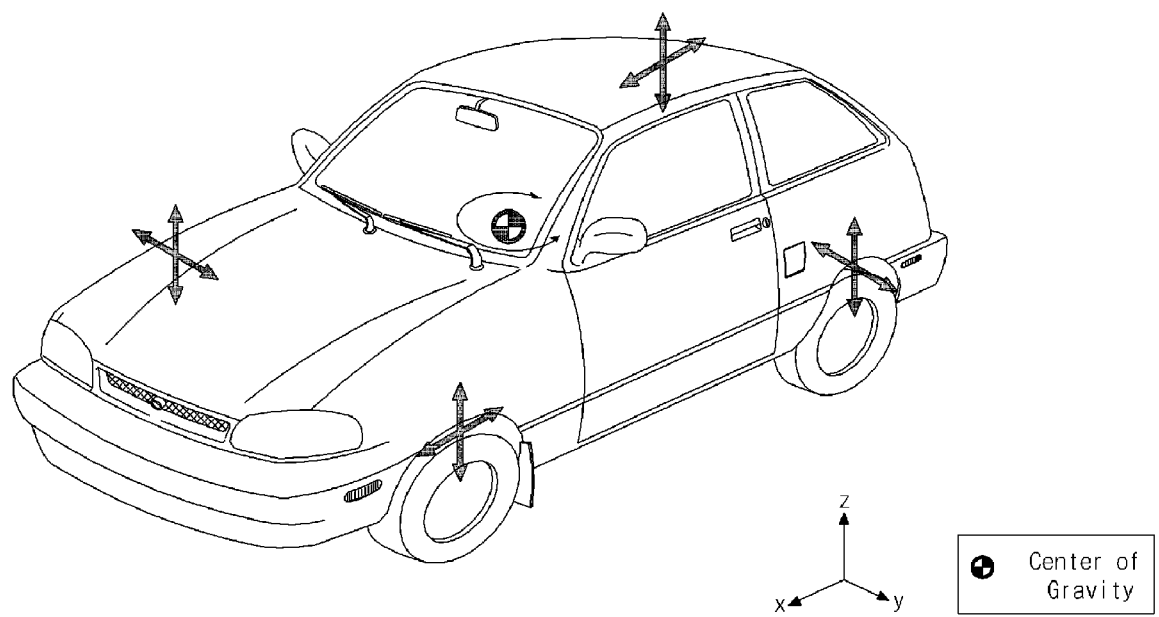
FIG. 13 is a view showing accelerations measured in case that all of dampers for the vehicle are equipped with a two-axial acceleration sensor.

In other embodiment, as shown in FIG. 13, the damper 10 of the present invention may be provided at all of the installation positions and each damper 10 may be equipped with the two-axial acceleration sensor.

In this case, if the two-axial acceleration sensors equipped in each damper 10 are the same kind, one of the x and y-axial accelerations can not be obtained.

Therefore, the x-z axial acceleration sensor is provided at one end of the front axle and the y-z axial acceleration sensor is provided at the other, and also the x-z axial acceleration sensor is provided at one end of the rear axle and the y-z axial acceleration sensor is provided at the other. The same acceleration sensors provided at the front and rear axles are diagonally disposed.

If the x-z axial acceleration sensors are respectively provided at the left side of the front axle and the right side of the rear axle, the y-z axial acceleration sensors are respectively provided at the right side of the front axle and the left side of the rear axle, and vice versa.

Accordingly, although the two-axial acceleration sensor is used, since the x and y-axial accelerations of the vehicle can be measured at both of the front and rear sides of the vehicle, it is possible to estimate the pitch angle, the rolling angle and the Yaw rate of the vehicle.

Figure 14:
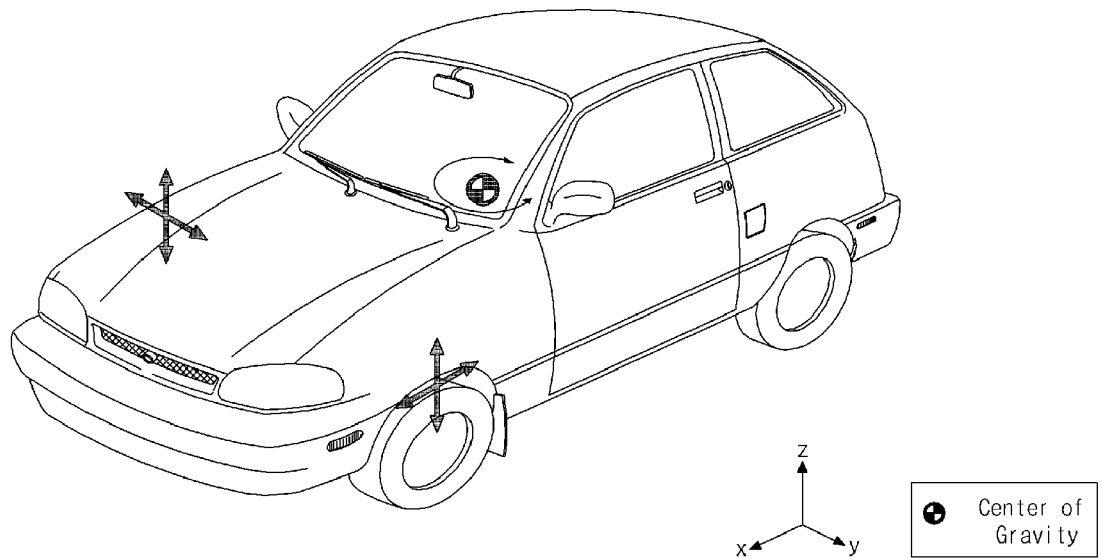
FIG. 14 is a view showing accelerations measured in case that the dampers equipped with the two-axial acceleration sensor are provided only at both sides of the front axle of the vehicle.

In another embodiment, as shown in FIG. 14, the damper 10 equipped with the two-axial acceleration sensor according to the present invention may be provided at both sides of the front axle.

In other words, the x-z axial acceleration sensor is provided at one end of the front axle, and the y-z axial acceleration sensor is provided at the other end thereof.

In this case, the x-axial acceleration of the entire vehicle can be estimated by using the x-z acceleration sensor and the y-axial acceleration thereof can be estimated by using the y-z axial acceleration sensor. And, the Yaw rate with respect to the center of gravity of the vehicle can be also estimated.

If driving environment like the road status is good, it is possible to stably control the vehicle movement through the estimation.

Figure 15:
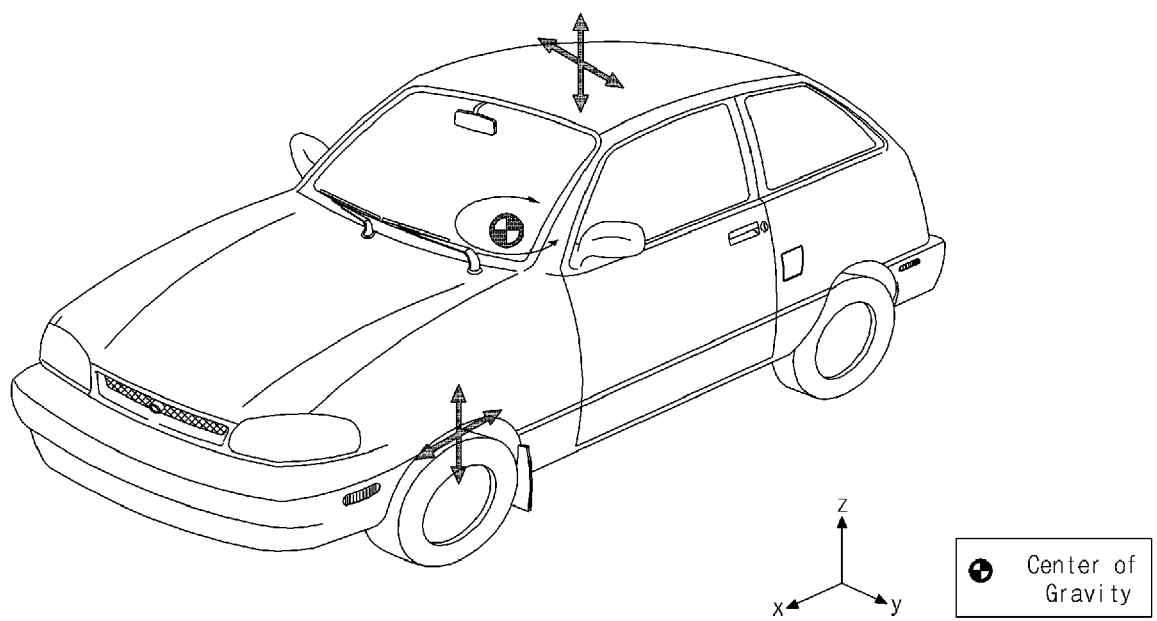
FIG. 15 is a view showing accelerations measured in case that the dampers equipped with the two-axial acceleration sensor are diagonally provided at one end of the front axle and the other end of a rear axle.

In yet another embodiment, as shown in FIG. 15, only the single damper 10 equipped with two-axial acceleration sensor according to the present invention may be provided at each of the front and rear axles of the vehicle and the dampers 10 are disposed diagonally.

In other words, the x-z axial acceleration sensor is provided at the front side of the vehicle and the y-z axial acceleration sensor is provided at the rear side thereof.

Also, in this case, the x-axial acceleration of the entire vehicle can be estimated by using the x-z acceleration sensor and the y-axial acceleration thereof can be estimated by using the y-z axial acceleration sensor. And, the Yaw rate with respect to the center of gravity of the vehicle can be also estimated.

Until now, the damper 10 using magneto-rheological fluid has been explained as an example, but it also is natural that the sensor module can be directly coupled with other kinds of electronic controlled dampers so as to feed back the detected results, thereby controlling the damping force.

Further, in the above embodiments of the present invention, the vehicle damper has been explained. However, since the embodiments are not limited to the vehicle damper, they can be applied to other dampers used in a landing gear for air plane, construction equipments like an excavator, industry equipments or equipments for factory automation.

It will be apparent to those skilled in the art that various modifications and variations can be made in the fabrication and application of the present invention without departing from the spirit or scope of the invention. Thus, it is intended that the present invention cover the modifications and variations of this invention provided they come within the scope of the appended claims and their equivalents.

According to the present invention, since the sensor module is directly coupled to the damper so as to precisely detect the movement of the damper, it is possible to precisely control the damping force of the damper on the basis of the detected results.

Further, since the sensor module includes the acceleration sensor and the relative displacement sensor, it is possible to confirm whether one of the sensors is out of order by comparing the detected data of both sensors. And in the case of one of the sensors is out of order, it is possible to control the damper using the detected results of the other sensor, thereby increasing the stability and reliability of the electronic controlled suspension system.

Furthermore, even in case of the vehicle which is provided with the active controlled suspension system, it is possible to simply and inexpensively embody the active controlled suspension system by replacing the existing damper with the damper of the present invention.

What is claimed is:

1. A damper comprising:
a cylinder which is formed with a hollow portion therein;
a piston rod which is inserted through an upper portion of the cylinder;
a piston valve which is connected with an end of the piston rod so as to reciprocate in the cylinder, the piston valve including a fluid passing hole;
a rod guide which air-tightly closes an upper end of the cylinder and has a though-hole in which the piston rod is inserted; and
a sensor module which is provided with an acceleration sensor for detecting an acceleration at least in a z-axial direction and a displacement sensor for detecting a displacement of the piston rod and which is coupled with the rod guide, wherein the rod guide is formed with a coupling hole which is communicated from an outer surface of the rod guide to the through-hole, and the sensor module is inserted into the coupling hole, and wherein the coupling hole is formed with an expanded portion which is wider than an entrance formed at the outer surface of the rod guide, and a housing of the sensor module is formed with a protruded portion which is inserted into the expanded portion so as to prevent the sensor module from being separated from the rod guide.

2. The damper according to claim 1, wherein the coupling hole is opened toward an upper surface of the rod guide, and a fixing cap for fixing the sensor module inserted into the coupling hole is coupled to an upper portion of the rod guide.

3. A damper comprising:

a cylinder which is formed with a hollow portion therein;

a piston rod which is inserted through an upper portion of the cylinder;

a piston valve which is connected with an end of the piston rod so as to reciprocate in the cylinder, the piston valve including a fluid passing hole;

a rod guide which air-tightly closes an upper end of the cylinder and has a though-hole in which the piston rod is inserted, wherein a groove pattern, in which a concave portion and a convex portion are formed alternately and which is formed in a direction substantially perpendicular to a movement direction of the piston rod, is formed on a portion of the piston rod; and a sensor module which is provided with an acceleration sensor for detecting an acceleration at least in a z-axial direction and a displacement sensor for detecting a displacement of the piston rod and which is coupled with the rod guide, the displacement sensor is having a non-contact type comprises, a magnet for generating magnetic field;

a giant magneto resistance (GMR) sensor which is disposed between the magnet and the piston rod so as to detect a change of the magnetic field generated by the groove pattern when the piston rod is moved and thus to output an electric signal; and a signal processing part which processes an output signal from the GMR sensor and then outputs a square wave.

4. The damper according to claim 3, wherein the GMR sensor has a construction in which a serially connected pair of a first resistance element and a second resistance element is disposed be parallel with a serially connected pair of a third resistance element and a fourth resistance element, and the electric signal is an output voltage generated by the change of the magnetic field between a first node between the first and second resistance elements and a second node between the third and fourth resistance elements.

5. The damper according to claim 3, wherein the GMR sensor is provided with a first sub-sensor and a second sub-sensor which detect the change of the magnetic field and than output the electric signal, respectively, and ends of the first and second sub-sensors and are spaced away from each other at a desired distance in the moving direction of the piston rod, and when the piston rod is moved, the output signals from the first and second sub-sensors are respectively generated with a time lag.

6. An electronically controllable suspension system comprising:

a plurality of dampers which are provided between each end of front and rear axles and a vehicle body and respectively provided with a sensor module equipped with an acceleration sensor and a displacement sensor, wherein the acceleration sensor and the displacement sensor measure an acceleration data and a displacement data, respectively; and a control module which receives a detecting signal of the acceleration sensor and the displacement sensor equipped in the damper so as to analyze a vehicle movement, generate a control signal for controlling damping force of the damper and transfer the control signal to the damper, wherein the control module obtains a secondary acceleration data by differentiating the displacement data and a secondary displacement data by integrating the acceleration data, and wherein the control module compares the acceleration data with the secondary acceleration data and compares the displacement data with the secondary displacement data to detect possible out of order of one of the acceleration sensor and the displacement sensor.

7. The electronically controllable suspension system according to claim 6, wherein the damper comprises a cylinder which is formed with a hollow portion therein;

a piston rod which is inserted through an upper portion of the cylinder;

a piston valve which is connected with an end of the piston rod so as to reciprocate in the cylinder, the piston valve including a fluid passing hole; and a rod guide which air-tightly closes an upper end of the cylinder and has a though-hole in which the piston rod is inserted, and the sensor module is coupled to the rod guide.

8. The electronically controllable suspension system according to claim 6, wherein the sensor module equipped in each of the plurality of dampers is provided with a three-axial acceleration sensor which can measure x, y and z-axial accelerations.

9. The electronically controllable suspension system according to claim 6, wherein first and second dampers out of the plurality of dampers, which are provided at both ends of a front axle, are respectively provided with the sensor module equipped with the three-axial acceleration sensor.

10. The electronically controllable suspension system according to claim 6, wherein a first damper out of the plurality of dampers, which is provided at one end of the front axle, is provided with the sensor module equipped with a first acceleration sensor which can measure a first horizontal and vertical acceleration, a second damper, which is provided at the other end of the front axle, is provided with the sensor module equipped with a second acceleration sensor which can measure a second horizontal and vertical acceleration, a third damper, which is provided at one end of the rear axle so as to be diagonally disposed with respect to the first damper, is provided with the sensor module equipped with a third acceleration sensor which can measure the first horizontal and vertical acceleration, and a fourth damper, which is provided at the other end of the rear axle so as to be diagonally disposed with respect to the second damper, is provided with the sensor module equipped with a fourth acceleration sensor which can measure the second horizontal and vertical acceleration.

11. The electronically controllable suspension system according to claim 6, wherein a first damper out of the plurality of dampers, which is provided at one end of the front axle, is provided with the sensor module equipped with a first acceleration sensor which can measure a first horizontal and vertical acceleration, and a second damper, which is provided at the other end of the front axle, is provided with the sensor module equipped with a second acceleration sensor which can measure a second horizontal and vertical acceleration.

12. The electronically controllable suspension system according to claim 6, wherein a first damper out of the plurality of dampers, which is provided at one end of the front axle, is provided with the sensor module equipped with a first acceleration sensor which can measure a first horizontal and vertical acceleration, and a second damper, which is provided at one end of the rear axle so as to be diagonally disposed with respect to the first damper, is provided with the sensor module equipped with a second acceleration sensor which can measure a second horizontal and vertical acceleration.

13. A method of controlling a vehicle movement of a vehicle using an electronically controllable suspension system having an acceleration sensor and a displacement sensor, comprising:

a first step of measuring an acceleration data with the acceleration sensor and measuring a displacement data with the displacement sensor;

a second step of obtaining a secondary acceleration data by differentiating the displacement data and obtaining a secondary displacement data by integrating the acceleration data;

a third step of comparing the acceleration data with the secondary acceleration data and comparing the displacement data with the secondary displacement data to detect possible out of order of one of the acceleration sensor and the displacement sensor;

a fourth step of analyzing the vehicle movement using a detected result of the acceleration sensor and the displacement sensor; and a fifth step of controlling the vehicle movement by feeding back an analyzed result and adjusting damping force of a damper.

14. The method according to claim 13, wherein the fourth step comprises at least one of:

a process for analyzing a pitch angle of the vehicle using a first horizontal acceleration measured by the acceleration sensor;

a process for analyzing a rolling angle of the vehicle using a second horizontal acceleration measured by the acceleration sensor; and a process for analyzing a Yaw rate of the vehicle using the first and second horizontal accelerations measured by the acceleration sensor.

15. A sensor module which is coupled to a damper so as to detect a relative displacement of a piston rod having a groove pattern and an acceleration of an object in which the damper is installed, comprising:

a magnet for generating magnetic field;

a giant magneto resistance (GMR) sensor which is disposed between the magnet and the piston rod so as to detect a change of magnetic field generated by the groove pattern when the piston rod is moved and thus to output an electric signal;

a signal processing part which processes an output signal from the GMR sensor and then outputs a square wave;

an acceleration sensor for detecting an acceleration at least in a z-axial direction;

a housing in which the magnet, the GMR sensor, the signal processing part and the acceleration sensor are received; and a cable which is extended to an outside of the housing so as to transfer an output signal of the signal process part and the output signal of the acceleration sensor to a control module of a vehicle.

* * * * *